(12) United States Patent
Hsieh et al.

(10) Patent No.: US 8,981,536 B1
(45) Date of Patent: Mar. 17, 2015

(54) SEMICONDUCTOR STRUCTURE

(71) Applicant: Chipbond Technology Corporation, Hsinchu (TW)

(72) Inventors: Chin-Tang Hsieh, Kaohsiung (TW); You-Ming Hsu, Kaohsiung (TW); Ming-Sheng Liu, Hsinchu (TW); Chih-Ping Wang, Hsinchu County (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 14/048,078

(22) Filed: Oct. 8, 2013

(30) Foreign Application Priority Data

Sep. 27, 2013 (TW) .............................. 102134937 A

(51) Int. Cl.
*H01L 29/06* (2006.01)
*H01L 23/58* (2006.01)
*H01L 23/495* (2006.01)
*H01L 23/00* (2006.01)
*H01L 29/02* (2006.01)

(52) U.S. Cl.
CPC .............. *H01L 23/562* (2013.01); *H01L 29/02* (2013.01)

USPC ............ 257/632; 257/626; 257/637; 257/669

(58) Field of Classification Search
CPC ........ H01L 23/28; H01L 23/562; H01L 29/02
USPC ................... 257/626, 632, 637, 669
See application file for complete search history.

(56) References Cited

U.S. PATENT DOCUMENTS

2011/0215447 A1* 9/2011 Furusawa et al. ............. 257/637

* cited by examiner

*Primary Examiner* — David S Blum
(74) *Attorney, Agent, or Firm* — Jackson IPG PLLC

(57) ABSTRACT

A semiconductor structure includes a carrier, a first protective layer, a second protective layer, and a third protective layer. A first surface of the first protective layer comprises a first anti-stress zone. The second protective layer reveals the first anti-stress zone and comprises a second surface, a first lateral side, a second lateral side and a first connection side. The second surface comprises a second anti-stress zone. An extension line of the first lateral side intersects with an extension line of the second lateral side to form a first intersection point. A zone formed by connecting the first intersection point and two points of the first connection side is the first anti-stress zone. The third protective layer reveals the second anti-stress zone and comprises a second connection side projected on the first surface to form a projection line parallel to the first connection side.

6 Claims, 6 Drawing Sheets

SEMICONDUCTOR STRUCTURE

FIELD OF THE INVENTION

The present invention is generally related to a semiconductor structure, which particularly relates to the semiconductor structure with an anti-stress zone.

BACKGROUND OF THE INVENTION

A conventional semiconductor structure 200 illustrated in FIG. 6 comprises a carrier 210, a first protective layer 220, a second protective layer 230 and a third protective layer 240. The shape of the first protective layer 220, the second protective layer 230 and the third protective layer 240 is quadrangle. Besides, the first protective layer 220, the second protective layer 230 and the third protective layer 240 are disposed at the carrier 210 and arranged in a layer-by-layer stack. For mentioned features of those protective layers, the stress of the semiconductor structure 200 likely concentrates at a corner that is overlapped between the first protective layer 220 and the second protective layer 230 such that the corner might be cracked or separated therefore lowering the production yield of the semiconductor structure 200.

SUMMARY

The primary object of the present invention is to provide a semiconductor structure. The indentations of a second protective layer and a third protective layer prevents the stress of multilayer-stacked protective layers from concentrating at one of the protective layers to avoid damage of the semiconductor structure.

A semiconductor structure having at least one corner includes a carrier, a first protective layer, a second protective layer and a third protective layer. The carrier comprises a carrier surface having a protection-layered disposing zone and a protection-layered exposing zone located outside the protection-layered disposing zone. The first protective layer is disposed on the protection-layered disposing zone and comprises a first surface having a first disposing zone, at least one first anti-stress zone and a first exposing zone located outside the first disposing zone and the at least one first anti-stress zone. The at least one first anti-stress is located at the at least one corner and located between the first disposing zone and the first exposing zone. The second protective layer is disposed at the first disposing area, and the second protective layer reveals the at least one first anti-stress zone and the first exposing zone. The second protective layer comprises a second surface, a first lateral side, a second lateral side and a first connection side connected to the first lateral side and the second lateral side, wherein the second surface comprises a second disposing zone, at least one second anti-stress zone and a second exposing zone located outside the second disposing zone and the at least one second anti-stress zone. The at least one second anti-stress zone is located at the at least one corner, and the second anti-stress zone is located between the second disposing zone and the second exposing zone. An extension line of the first lateral side intersects with an extension line of the second lateral side to form a first intersection point, the first connection side comprises a first point and a second point, and a zone formed by connecting the first intersection point, the first point and the second point is the at least one first anti-stress zone. The third protective layer is disposed at the second disposing zone and reveals the at least one second anti-stress zone and the second exposing zone. The third protective layer comprises a third lateral side, a fourth lateral side and a second connection side connected to the third lateral side and the fourth lateral side. An extension line of the third lateral side intersects with an extension line of the fourth lateral side, the second connection side comprises a third point and a fourth point, and a zone formed by connecting the second intersection point, the third point and the fourth point is the at least one second anti-stress zone. The second connection side is projected on the first surface to form a projection line situated on the first surface, and the projection line is parallel to the first connection side of the second protective layer.

Owing to the first surface of the first protective layer possessing the at least one anti-stress zone, the second protective layer revealing the at least one anti-stress zone, the second surface of the second protective layer possessing the at least one second anti-stress zone, and the third protective layer revealing the at least one second anti-stress zone, the stress of the semiconductor structure does not concentrate at the at least one corner of the second protective layer to prevent the at least one corner of the semiconductor structure from cracks or separations.

DETAILED DESCRIPTION OF THE INVENTION

Figure 1:
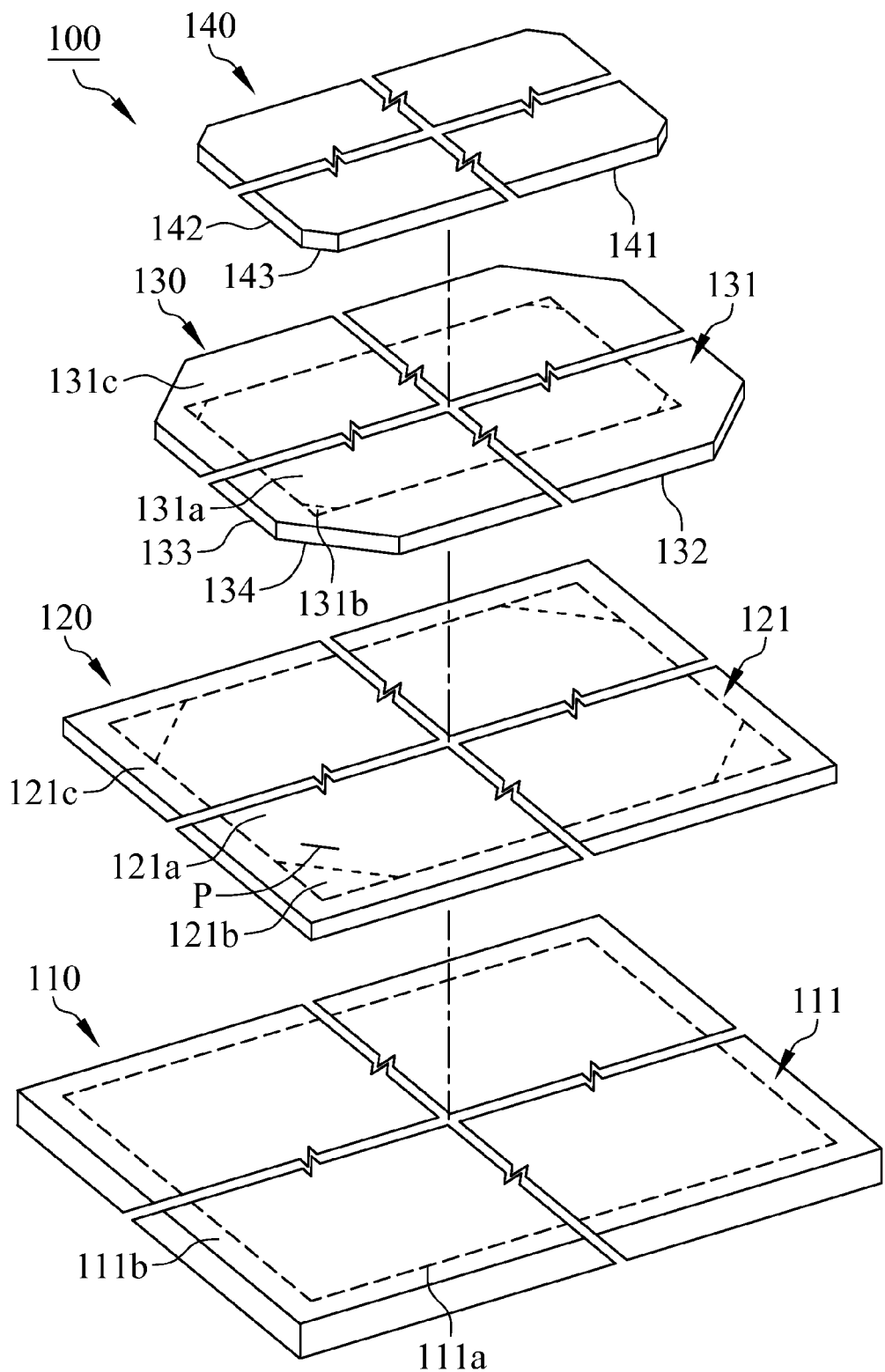
FIG. 1 is a perspective exploded diagram illustrating a semiconductor structure in accordance with a first embodiment of the present invention.
Figure 2:
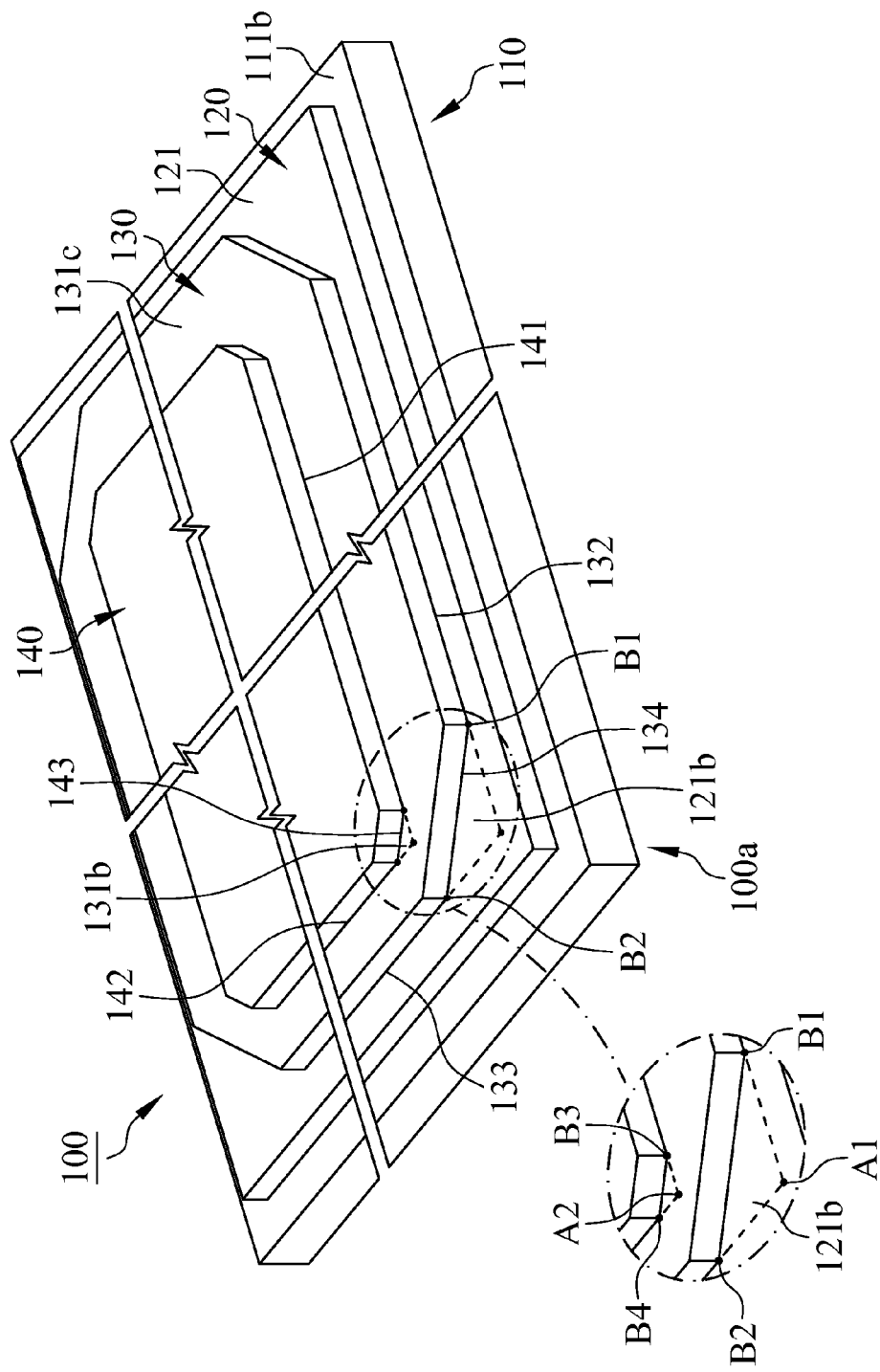
FIG. 2 is a perspective diagram illustrating the semiconductor structure in accordance with the first embodiment of the present invention.

With reference to FIGS. 1 and 2, a semiconductor structure 100 having at least one corner 100*a* in accordance with a first embodiment of the present invention includes a carrier 110, a first protective layer 120, a second protective layer 130, and a third protective layer 140. The carrier 110 comprises a carrier surface 111 having a protection-layered disposing zone 111*a* and a protection-layered exposing zone 111*b* located outside the protection-layered disposing zone 111*a*. The first protective layer 120 is disposed at the protection-layered disposing zone 111*a* and comprises a first surface 121 having a first disposing zone 121*a*, at least one first anti-stress zone 121*b* and a first exposing zone 121*c* located outside the first disposing zone 121*a* and the at least one first anti-stress zone 121*b*. The at least one first anti-stress zone 121*b* is located at the at least one corner 100*a* of the semiconductor structure 100, and the at least one first anti-stress zone 121*b* is located between the first disposing zone 121*a* and the first exposing zone 121*c*. In this embodiment, the shape of the at least one anti-stress zone 121*b* is a triangle.

With reference to FIGS. 1 and 2, the second protective layer 130 is disposed at the first disposing zone 121*a* and reveals the at least one first anti-stress zone 121*b* and the first exposing zone 121*c*. The second protective layer 130 comprises a second surface 131, a first lateral side 132, a second lateral side 133 and a first connection side 134 connected to the first lateral side 132 and the second lateral side 133. The second surface 131 comprises a second disposing zone 131a, at least one second anti-stress zone 131b and a second exposing zone 131c located outside the second disposing zone 131a and the at least one second anti-stress zone 131b.

Referring to FIG. 2, the at least one second anti-stress zone 131b is located at the at least one corner 100a, and the at least one second anti-stress zone 131b is located between the second disposing zone 131a and the second exposing zone 131c. An extension line of the first lateral side 132 intersects with an extension line of the second lateral side 133 to form a first intersection point A1, and the first connection side 134 comprises a first point B1 and a second point B2. In this embodiment, a zone formed by connecting the first intersection point A1, the first point B1 and the second point B2 is the at least one first anti-stress zone 121b. The first connection side 134 is a flat surface.

Figure 3:
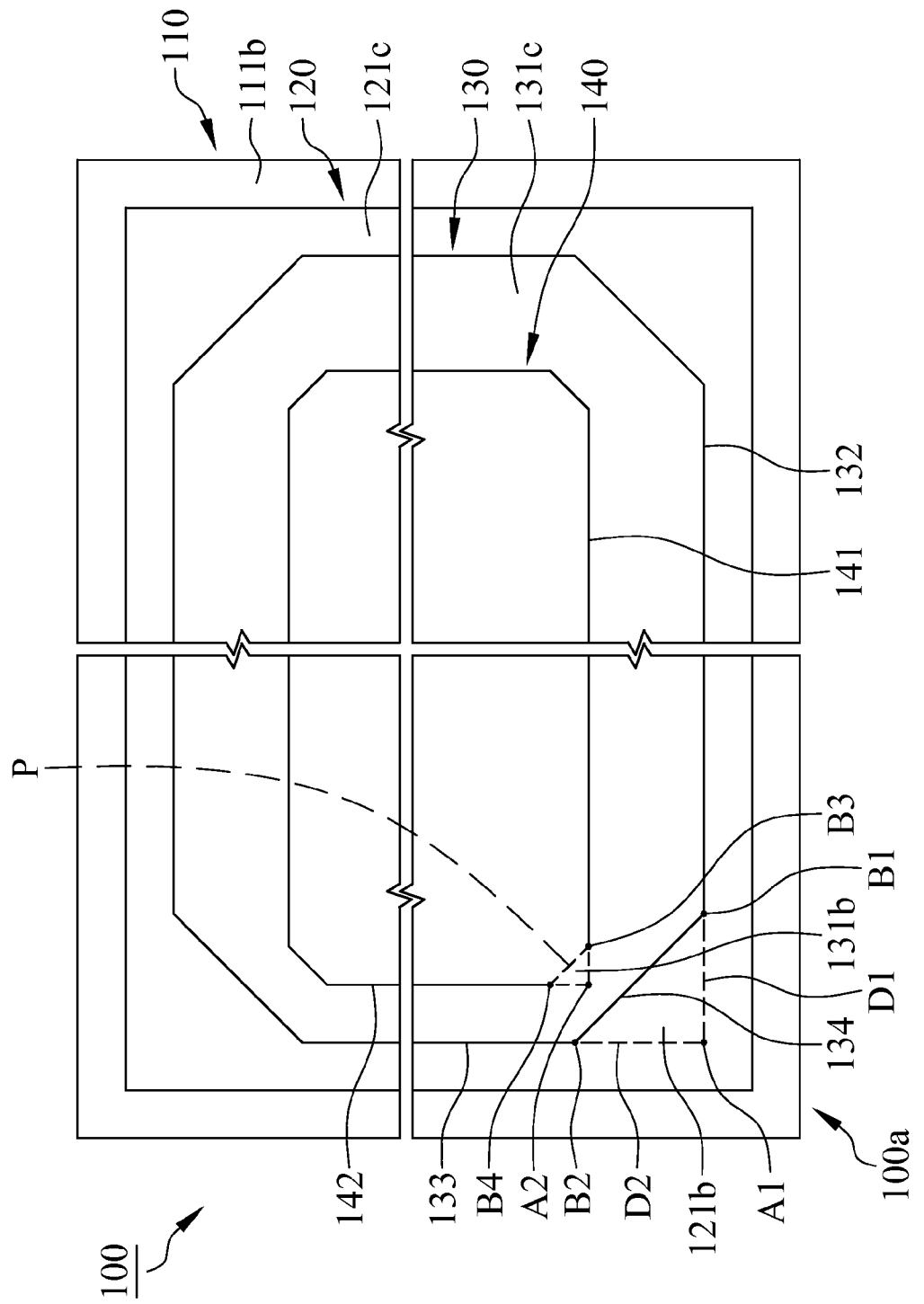
FIG. 3 is a top view illustrating the semiconductor structure in accordance with the first embodiment of the present invention.

With reference to FIG. 3, a first distance D1 is spaced apart between the first intersection point A1 and the first point B1, a second distance D2 is spaced apart between the first intersection point A1 and the second point B2, and the first distance D1 is equal to the second distance D2. With reference to FIGS. 1 and 3, the third protective layer 140 is disposed at the second disposing zone 131a and reveals the at least one second anti-stress zone 131b and the second exposing zone 131c. The third protective layer 140 comprises a third lateral side 141, a fourth lateral side 142 and a second connection side 143 connected to the third side 141 and the fourth side 142, wherein an extension line of the third lateral side 141 intersects with an extension line of the fourth lateral side 142 to form a second intersection line A2. The second connection side 143 is a flat surface, the second connection side 143 is projected on the first surface 121 of the first protective layer 120 to form a projection line P that is situated on the first surface 121, and the projection line P is located at the first disposing zone 121a and parallel to the first connection side 134 of the second protective layer 130.

With reference to FIGS. 2 and 3, the second connection side 143 comprises a third point B3 and a fourth point B4, and a zone formed by connecting the second intersection point A2, the third point B3 and the fourth point B4 is the at least one second anti-stress zone 131b. In this embodiment, the shape of the at least one second anti-stress zone 131b is a triangle. Besides, owing to the projection line P from the second connection side 143 parallel to the first connection side 134 of the second protective layer 130, the shape of the at least one first anti-stress zone 121b and the at least one second anti-stress zone 131b is a similar triangle.

In this invention, the second protective layer 130 and the third protective layer 140 both possess indentations for revealing the at least one first anti-stress zone 121b and the at least one second anti-stress zone 131b respectively, and the shape of the first anti-stress zone 121b and the second anti-stress zone 131b is the similar triangle. Mentioned features prevent the stress of the semiconductor structure 100 from concentrating at the corner of the second protective layer 130 so that cracks or separations from the at least one 100a corner can be avoidable.

Figure 4:
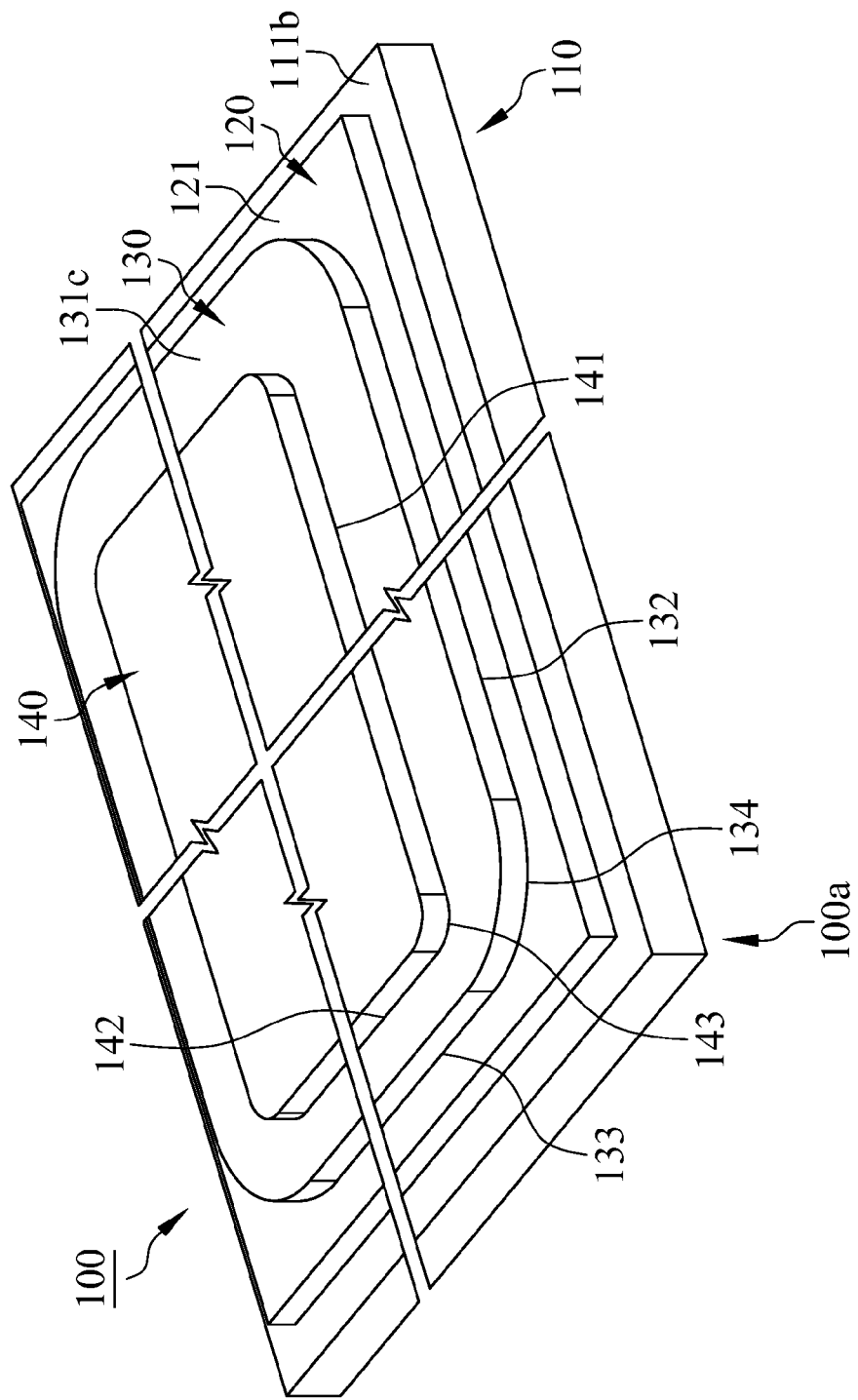
FIG. 4 is a perspective diagram illustrating a semiconductor structure in accordance with a second embodiment of the present invention.
Figure 5:
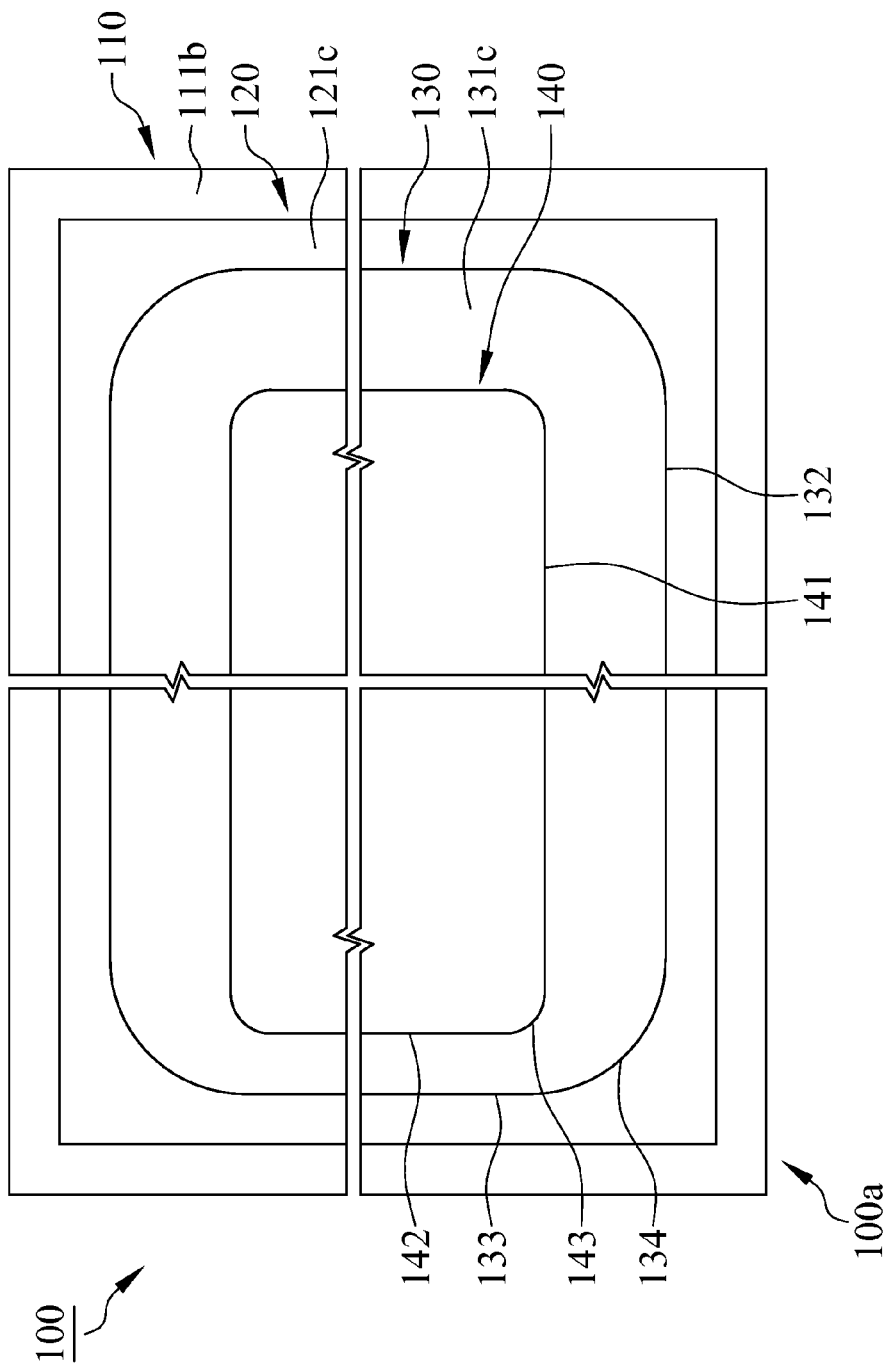
FIG. 5 is a top view illustrating the semiconductor structure in accordance with the second embodiment of the present invention.
Figure 6:
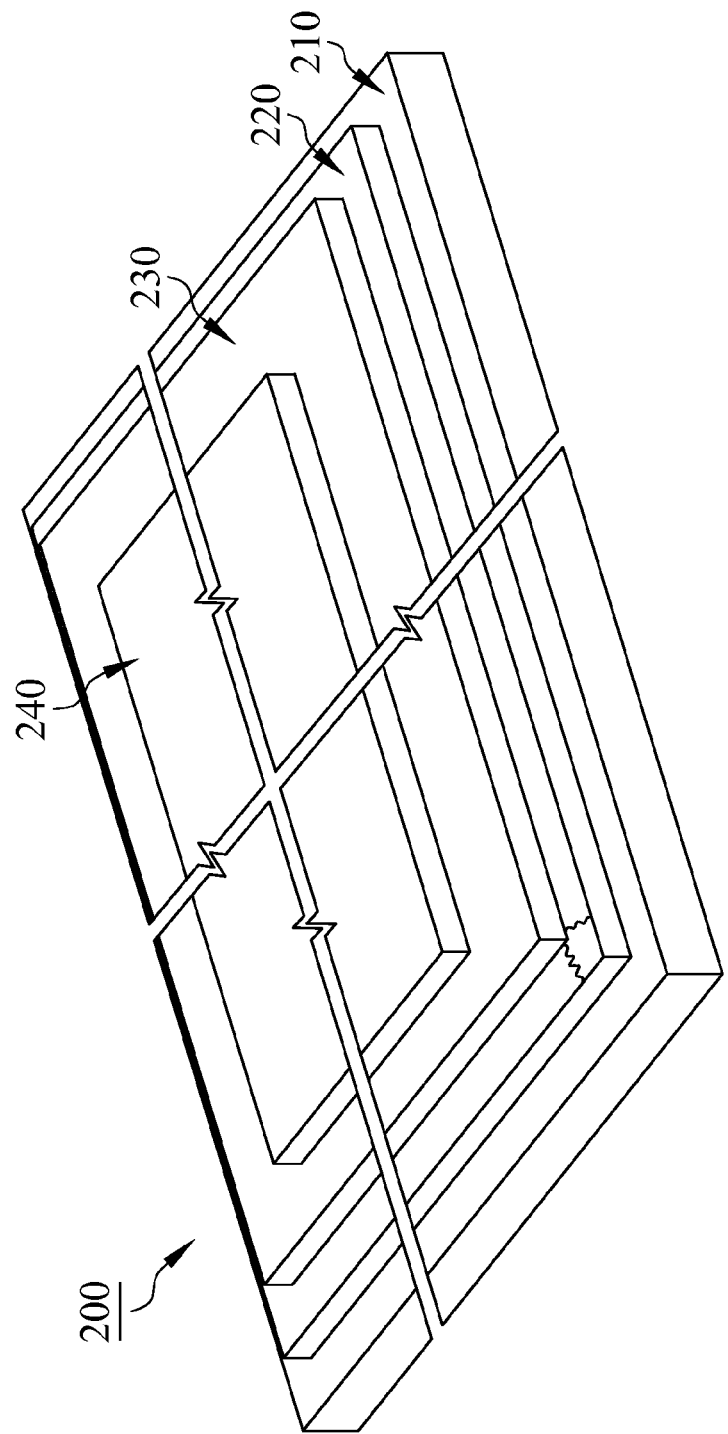
FIG. 6 is a perspective diagram of a conventional semiconductor structure.

A second embodiment of the present invention is illustrated in FIGS. 4 and 5, the primary difference between the second embodiment and the first embodiment is that the first connection side 134 and the second connection side 143 are arc surfaces.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A semiconductor structure having at least one corner includes:
   a carrier having a carrier surface, the carrier surface comprises a protection-layered disposing zone and a protection-layered exposing zone located outside the protection-layered disposing zone;
   a first protective layer disposed at the protection-layered disposing zone and having a first surface, the first surface comprises a first disposing zone, at least one first anti-stress zone and a first exposing zone located outside the first disposing zone and the at least one first anti-stress zone, wherein the at least one first anti-stress zone is located at the at least one corner and located between the first disposing zone and the first exposing zone;
   a second protective layer disposed at the first disposing zone and revealing the at least one first anti-stress zone and the first exposing zone, the second protective layer comprises a second surface, a first lateral side, a second lateral side and a first connection side connected to the first lateral side and the second lateral side, the second surface comprises a second disposing zone, at least one second anti-stress zone and a second exposing zone located outside the second disposing zone and the at least one second anti-stress zone, wherein the at least one second anti-stress zone is located at the at least one corner and located between the second disposing zone and the second exposing zone, wherein an extension line of the first lateral side intersects with an extension line of the second lateral side to form a first intersection point, the first connection side comprises a first point and a second point, wherein a zone formed by connecting the first intersection point, the first point and the second point is the at least one first anti-stress zone; and
   a third protective layer disposed at the second disposing zone and revealing the at least one second anti-stress zone and the second exposing zone, the third protective layer comprises a third lateral side, a fourth lateral side and a second connection side connected to the third lateral side and the fourth lateral side, wherein an extension line of the third lateral side intersects with an extension line of the fourth lateral side to form a second intersection point, the second connection side comprises a third point and a fourth point, wherein a zone formed by connecting the second intersection point, the third point and the fourth point is the at least one second anti-stress zone, the second connection side is projected on the first surface of the first protective layer to form a projection line parallel to the first connection side of the second protective layer.

2. The semiconductor structure in accordance with claim 1, wherein the first connection side is a flat surface or an arc surface.

3. The semiconductor structure in accordance with claim 1, wherein the second connection side is a flat surface or an arc surface.

4. The semiconductor structure in accordance with claim 1, wherein a first distance is spaced apart between a first intersection point and the first point, a second distance is spaced apart between the first intersection point and the second point, and the first distance is equal to the second distance.

5. The semiconductor structure in accordance with claim 1, wherein the shape of the at least one first anti-stress zone and the at least one second anti-stress zone is a triangle.

6. The semiconductor structure in accordance with claim 5, wherein the shape of the at least one first anti-stress zone and the at least one second anti-stress zone is a similar triangle.

* * * * *